(12) United States Patent
Lim et al.

(10) Patent No.: US 11,876,397 B2
(45) Date of Patent: Jan. 16, 2024

(54) APPARATUS AND METHOD FOR CONTROLLING STEP CHARGING OF SECONDARY BATTERY

(71) Applicant: LG CHEM, LTD., Seoul (KR)

(72) Inventors: Jin-Hyung Lim, Daejeon (KR); Young-Jin Kim, Daejeon (KR); Gi-Min Nam, Daejeon (KR); Hyoung Jun Ahn, Daejeon (KR); Kyu-Chul Lee, Daejeon (KR); Won-Tae Joe, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 467 days.

(21) Appl. No.: 17/280,789

(22) PCT Filed: Oct. 30, 2019

(86) PCT No.: PCT/KR2019/014495
§ 371 (c)(1),
(2) Date: Mar. 26, 2021

(87) PCT Pub. No.: WO2020/130324
PCT Pub. Date: Jun. 25, 2020

(65) Prior Publication Data
US 2022/0006313 A1    Jan. 6, 2022

(30) Foreign Application Priority Data
Dec. 21, 2018 (KR) .......................... 10-2018-0167927

(51) Int. Cl.
*H02J 7/00* (2006.01)
*G01R 31/3835* (2019.01)
(Continued)

(52) U.S. Cl.
CPC ...... *H02J 7/007186* (2020.01); *G01R 31/367* (2019.01); *G01R 31/374* (2019.01); *G01R 31/3835* (2019.01); *H02J 7/007194* (2020.01)

(58) Field of Classification Search
CPC .......... H02J 7/007186; H02J 7/007194; H02J 7/00714; H02J 7/007182; H02J 7/0048;
(Continued)

(56) References Cited

U.S. PATENT DOCUMENTS 9,667,079 B2 *  5/2017  Takano ................. H02J 7/0048
2003/0090238 A1  5/2003  Wolin et al.
(Continued)

FOREIGN PATENT DOCUMENTS

JP  2003-197275 A  7/2003
JP  2003-199262 A  7/2003
(Continued)

OTHER PUBLICATIONS

International Search Report (with partial translation) and Written Opinion issued in corresponding International Patent Application No. PCT/KR2019/014495, dated Feb. 25, 2020.
(Continued)

*Primary Examiner* — Nha T Nguyen
(74) *Attorney, Agent, or Firm* — Morgan, Lewis & Bockius LLP

(57) ABSTRACT

Disclosed is an apparatus and method for controlling step charging of a secondary battery. A charging control unit determines a SOC, an OCV and a polarization voltage of the secondary battery, determines an OCV deviation corresponding to a difference between the OCV and a predefined minimum OCV value, determines a correction factor corresponding to the polarization voltage and the OCV deviation, determines a look-up SOC by correcting the SOC according to the correction factor, determines the magnitude of a
(Continued)

charging current corresponding to the look-up SOC, and provides the determined charging current to a charging device.

15 Claims, 9 Drawing Sheets

(51) Int. Cl.
*G01R 31/367* (2019.01)
*G01R 31/374* (2019.01)

(58) Field of Classification Search
CPC .............. H02J 7/007192; G01R 31/367; G01R 31/374; G01R 31/3835; G01R 31/3842; H01M 10/425; H01M 10/443; H01M 10/46; H01M 10/48; H01M 10/486; H01M 2010/4278; H01M 10/44; Y02E 60/10
See application file for complete search history.

(56) References Cited

U.S. PATENT DOCUMENTS

| | | |
|---|---|---|
| 2004/0257087 A1 | 12/2004 | Murakami |
| 2006/0152196 A1 | 7/2006 | Matsumoto et al. |
| 2007/0299620 A1 | 12/2007 | Yun et al. |
| 2011/0084702 A1* | 4/2011 | Mori .................. H01M 10/482 |
| | | 320/132 |
| 2011/0156713 A1 | 6/2011 | Akamine et al. |
| 2014/0035513 A1 | 2/2014 | Kroenke et al. |
| 2014/0320085 A1 | 10/2014 | Chang et al. |
| 2015/0236541 A1* | 8/2015 | Takano .................... H02J 7/00 |
| | | 320/137 |
| 2017/0141444 A1* | 5/2017 | Kawahara ............ G01R 31/392 |
| 2017/0199247 A1 | 7/2017 | Joe |
| 2017/0271887 A1 | 9/2017 | Heo |
| 2017/0310137 A1 | 10/2017 | Ha et al. |
| 2018/0226693 A1* | 8/2018 | Hong .................... G01R 31/388 |
| 2021/0210971 A1 | 7/2021 | Lim et al. |
| 2023/0268746 A1* | 8/2023 | Kang .................... H02J 7/0024 |
| | | 307/116 |

FOREIGN PATENT DOCUMENTS

| | | |
|---|---|---|
| JP | 2006-197727 A | 7/2006 |
| JP | 2008-010420 A | 1/2008 |
| JP | 2011-133414 A | 7/2011 |
| JP | 5372208 B2 | 12/2013 |
| JP | 2015-104139 A | 6/2015 |
| JP | 2015-224927 A | 12/2015 |
| JP | 2017-533691 A | 11/2017 |
| JP | 2018-082613 A | 5/2018 |
| KR | 10-2013-0142807 A | 12/2013 |
| KR | 10-2016-0048666 A | 5/2016 |
| WO | 2017/144110 A1 | 8/2017 |

OTHER PUBLICATIONS

Plett et al., "Extended Kalman Filtering for Battery Management Systems of LiPB-based HEV Battery Packs Part 1. Background," Journal of Power Sources 134 (2004), pp. 252-261.

Extended European Search Report dated Jan. 12, 2022, issued by the European Patent Office in corresponding European Patent Application No. 19901105.7.

Office Action dated Jan. 25, 2022 issued by the Japanese Patent Office in corresponding Japanese Patent Application No. 2020-562616.

* cited by examiner

FIG. 3

| TWSoc | 10% | 20% | 26% | 36% | 40% | 45% | 50% | 62% | 80% | 100% |
|---|---|---|---|---|---|---|---|---|---|---|
| 5℃ | ... | | | | | | | | | |
| 15℃ | 150A | 150A | 100A | 50A | 50A | 50A | 50A | 50A | 50A | 50A |
| 25℃ | 150A | 150A | 150A | 100A | 50A | 50A | 50A | 50A | 50A | 50A |
| 35℃ | 150A | 150A | 150A | 150A | 100A | 50A | 50A | 50A | 50A | 50A |
| 45℃ | ... | | | | | | | | | |

APPARATUS AND METHOD FOR CONTROLLING STEP CHARGING OF SECONDARY BATTERY

TECHNICAL FIELD

The present disclosure relates to an apparatus and method for controlling step charging of a secondary battery, and more particularly to an apparatus and method for controlling step charging of a secondary battery, which may shorten a charging time by adaptively changing a step charging control manner according to a state of charge (SOC) and a polarization voltage of the secondary battery before starting a charging process. The present application claims priority to Korean Patent Application No. 10-2018-0167927 filed on Dec. 21, 2018 in the Republic of Korea, the disclosures of which are incorporated herein by reference.

BACKGROUND ART

Recently, secondary batteries that can be repeatedly charged and regenerated are attracting attention as an alternative to fossil energy.

Secondary batteries are commonly used in traditional handheld devices such as mobile phones, video cameras and power tools, and more recently, its application field is gradually increasing to electric-driven vehicles (EVs, HEVs, PHEVs), large-capacity power storages (ESS), uninterruptible power supply systems (UPS), or the like.

Commercialized secondary batteries include nickel cadmium batteries, nickel hydrogen batteries, nickel zinc batteries, and lithium secondary batteries. Among them, lithium secondary batteries are in the spotlight due to their advantages such as substantially no memory effect, low self-discharge rate and high energy density compared to nickel-based secondary batteries.

Among various charging manners of the secondary battery, the step charging manner is a method of gradually adjusting the magnitude of a charging current according to the state of charge (SOC) and temperature of the secondary battery.

In a general step charging manner, the magnitude of the charging current is great at the initial stage of charging, and the magnitude of the charging current decreases step by step as charging is performed. The charging current is allocated differently for a plurality of divided SOC regions.

The magnitude of the charging current is relatively higher in a region with lower SOC than a region with higher SOC. In addition, the width of the SOC region where the magnitude of the charging current is constantly maintained decreases gradually toward the latter half of the charging. Therefore, as the charging is closer to an ending of the charging, the magnitude of the charging current decreases step by step, and the duration during which the charging current is constantly maintained is gradually shortened.

The conventional step charging manner is generally classified into two manners.

In the first manner, a limit SOC ($SOC_{max}$) is defined in a look-up table according to the charging current and temperature, $SOC_{max}$ corresponding to the charging current and temperature of each step is mapped from the look-up table, and then the magnitude of the charging current at the current stage is constantly maintained until the SOC of the secondary battery reaches $SOC_{max}$. Here, the look-up table may be represented by $SOC_{max}=F(I, T)$. I represents a charging current and T represents a temperature.

In the second method, the charging current $I_{max}$ that can be applied to the secondary battery at maximum is defined in a look-up table according to the SOC region and temperature, the charging current $I_{max}$ corresponding to the current SOC region and temperature is mapped from the look-up table, and then the charging current $I_{max}$ mapped in the current SOC region is continuously applied to the secondary battery. Here, the look-up table may be represented by $I_{max}=F(SOC, T)$. SOC represents a state of charge and T represents a temperature.

In the step charging manner, a condition for changing the charging current is determined in advance through experiments. That is, a maximum magnitude of the charging current that does not cause side reaction such as lithium precipitation is determined for each SOC region through the charging experiment, or an upper limit of SOC that can be reached without causing side reaction when the magnitude of the charging current is maintained is determined according to the magnitude of the charging current.

In the step charging manner, as the charging progresses, the magnitude of the charging current is gradually reduced while applying a maximum charging power acceptable by the secondary battery to the secondary battery, thereby shortening the charging time and preventing life degradation of the secondary battery.

Meanwhile, charging of the lithium secondary battery is affected by the polarization state at the start of charging. That is, even if the SOC of the secondary battery is identical before the start of charging, the magnitude of the charging current applied to the secondary battery must be adaptively adjusted according to the degree of polarization.

For example, if a no-load state is maintained for a long time before starting to charge the secondary battery, the polarization voltage is close to zero. That is, lithium ions are sufficiently diffused on the surface and inside of the active material of the electrode, so that the concentration of lithium ions is the same throughout the active material. However, if the no-load state is maintained for a short time before starting to charge the secondary battery, lithium ions are not sufficiently diffused, so the concentration of lithium ions is not uniform throughout the active material.

If the lithium ion concentration is not uniform in the electrode, the terminal voltage of the secondary battery includes a polarization voltage component in addition to the OCV component. The polarization voltage represents a positive value in the charging mode and a negative value in the discharging mode. In other words, the terminal voltage increases over OCV in the charging mode, and the terminal voltage is smaller than OCV in the discharging mode.

When there is a positive polarization voltage in the secondary battery, if the charging current $I_{max}$ corresponding to the SOC and the temperature is continuously applied to the secondary battery according to the normal step charging manner, lithium precipitation occurs before the SOC reaches a preset upper limit of the SOC. If the polarization voltage is positive, the concentration of lithium ions on the surface of the negative electrode active material is higher than that of the inside of the negative electrode active material, so the potential of the negative electrode quickly reaches 0 (zero) volt corresponding to the lithium precipitation condition.

On the contrary, when there is a negative polarization voltage in the secondary battery, the potential of the negative electrode increases in proportion to the polarization voltage. Therefore, lithium precipitation does not occur on the surface of the negative electrode even when the charging current $I_{max}$ corresponding to the SOC and temperature is applied to the secondary battery up to the preset upper limit of the SOC according to the common step charging manner. If the polarization voltage is negative, the concentration of lithium ions on the surface of the negative electrode active material is lower than that of the inside of the negative electrode active material, so the potential of the negative electrode slowly reaches 0 (zero) volt corresponding to the lithium precipitation condition.

Therefore, in the step charging of the secondary battery, it is necessary to figure out the degree of polarization of the secondary battery and apply the step charging manner differently.

Meanwhile, in the conventional step charging manner, the SOC region to which the step charging current is applied is uniformly fixed.

For example, if the magnitudes of the charging current for a 20-30% SOC region and a 30-40% SOC region are set as $I_{max,\ 20\text{-}30\%}$ and $I_{max,\ 30\text{-}40\%}$, respectively, the magnitude of the charging current is constantly $I_{max,\ 20\text{-}30\%}$ regardless whether the SOC before the start of charging is 20% or 25%, and the magnitude of the charging current is changed to $I_{max,\ 30\text{-}40\%}$ when the SOC reaches 30%. In addition, in the 30-40% SOC region, the charging current is maintained constant as $I_{max,\ 30\text{-}40\%}$.

However, if the SOC before the start of charging is in the middle region (25%) of the SOC region (20-30%), the magnitude of the charging current may be maintained to the beginning of the next SOC region (30-40%). This is because whether lithium is precipitated while applying a charging current ($I_{max,\ 20\text{-}30\%}$) of a specific magnitude to the secondary battery depends on how much the SOC of the secondary battery changes based on the SOC at the start of charging.

However, in the conventional step charging manner, the magnitude of the charging current is gradually reduced without considering the SOC at the start of charging. That is, even though the SOC has not increased to the extent to cause lithium precipitation based on the start of charging, the charging current is unconditionally reduced only when the SOC entered the next SOC region. This charging current control method has a limitation in reducing the charging time of the secondary battery.

DISCLOSURE

Technical Problem

The present disclosure is designed under the background of the related art as described above, and therefore the present disclosure is directed to providing an apparatus and method for controlling step charging of a secondary battery, which may shorten a charging time by adaptively changing the magnitude of a charging current applied to the secondary battery according to the SOC and polarization voltage of the secondary battery before starting a charging process.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for controlling step charging of a secondary battery, comprising: a voltage measuring unit, a current measuring unit and a temperature measuring unit configured to measure a voltage, a current and a temperature of the secondary battery, respectively; and a charging control unit operably coupled to the voltage measuring unit, the current measuring unit and the temperature measuring unit.

Preferably, the charging control unit is configured to execute a process including: a control logic for estimating a state of charge (SOC) and an open circuit voltage (OCV) of the secondary battery based on the measured voltage value, the measured current value and the measured temperature value before the start of charging of the secondary battery; a control logic for determining a polarization voltage of the secondary battery from at least an internal resistance of the secondary battery, the measured current value and the estimated OCV; a control logic for determining an OCV deviation corresponding to a difference between the estimated OCV and a predefined minimum OCV value; a control logic for determining a correction factor corresponding to the determined polarization voltage and the determined OCV deviation with reference to a predefined correlation between the polarization voltage and the correction factor and between the OCV deviation and the correction factor; a control logic for determining a look-up SOC by correcting the estimated SOC according to the correction factor; a control logic for determining the magnitude of a charging current corresponding to the look-up SOC and the measured temperature value with reference to a predefined correlation between the SOC and the charging current and between the temperature and the charging current; and a control logic for providing the determined charging current to a charging device so that a charging current corresponding to the determined magnitude of the charging current is applied to the secondary battery.

In an embodiment, the charging control unit may be configured to periodically estimate the SOC of the secondary battery from the measured voltage value, the measured current value and the measured temperature value by using an extended Kalman filter while the secondary battery is in a discharging mode or a sleeping mode and to determine the look-up SOC by correcting an SOC estimated just before the start of charging among the plurality of estimated SOCs.

In another embodiment, the charging control unit may be configured to estimate an OCV corresponding to the estimated SOC with reference to a predefined correlation between the SOC and the OCV.

In still another embodiment, the charging control unit may be configured to determine the polarization voltage according to an equation below:

$$dV_{pol}[k]=V_{cell}[k]-V_{OCV}[k]-I[k]R_0$$

where k is a time index, $dV_{pol}[k]$ is a polarization voltage, $V_{cell}[k]$ is a voltage estimated by an extended Kalman filter or a measured voltage, $V_{OCV}[k]$ is an OCV, $R_0$ is an internal resistance of the secondary battery, and $I[k]$ is a charging current of the secondary battery.

In still another embodiment, the charging control unit may be configured to determine the OCV deviation according to an equation below:

$$dV_{OCV}[k]=V_{OCV}[k]-V_{OCV,min}[k]$$

where k is a time index, $dV_{OCV}[k]$ is an OCV deviation, $V_{OCV}[k]$ is an OCV, and $V_{OCV,min}$ is a predefined minimum OCV value.

In still another embodiment, the charging control unit may be configured to determine the look-up SOC according to an equation below:

$$SOC_{lookup}[k]=SOC_{estimated}[k]-dSOC(dV_{OCV}[k],dV_{pol}[k])$$

where k is a time index, $SOC_{lookup}[k]$ is a look-up SOC, $SOC_{estimate}[k]$ is an estimated SOC, $dV_{ocv}[k]$ is an OCV deviation, $dV_{pol}[k]$ is a polarization voltage, and dSOC is a look-up table defining a correlation between the OCV deviation and the correction factor and between the polarization voltage and the correction factor.

Preferably, the charging control unit may be configured to determine the correction factor to be proportional to the OCV deviation and to determine the correction factor to be inversely proportional to the polarization voltage.

In another aspect of the present disclosure, there is also provided a method for controlling step charging of a secondary battery, comprising: (a) measuring a voltage, a current and a temperature of the secondary battery while the secondary battery is in a discharging mode or a sleeping mode; (b) estimating a state of charge (SOC) and an open circuit voltage (OCV) of the secondary battery based on the measured voltage value, the measured current value and the measured temperature value before the start of charging of the secondary battery; (c) determining a polarization voltage of the secondary battery from at least an internal resistance of the secondary battery, the measured current value and the estimated OCV; (d) determining an OCV deviation corresponding to a difference between the estimated OCV and a predefined minimum OCV value; (e) determining a correction factor corresponding to the determined polarization voltage and the determined OCV deviation with reference to a predefined correlation between the polarization voltage and the correction factor and between the OCV deviation and the correction factor; (f) determining a look-up SOC by correcting the estimated SOC according to the correction factor; (g) determining the magnitude of a charging current corresponding to the look-up SOC and the measured temperature value with reference to a predefined correlation between the SOC and the magnitude of the charging current and between the temperature and the magnitude of the charging current; and (h) providing the determined charging current to a charging device so that a charging current corresponding to the determined magnitude of the charging current is applied to the secondary battery.

In another aspect of the present disclosure, there is also provided an electric-driven device, comprising the apparatus for controlling step charging of a secondary battery.

Advantageous Effects

According to the present disclosure, the step charging time of the secondary battery can be shortened compared to the conventional art by adaptively controlling the magnitude of the charging current in consideration of the SOC ($dV_{ocv}$) and the polarization voltage ($dV_{pol}$) of the secondary battery at the same time before the start of charging. In particular, the charging time of the secondary battery can be shortened by increasing the upper limit of a SOC region where the charging current is relatively large. In addition, the charging time may be reduced more effectively by extending the upper limit of a SOC region where the charging current is changed when the secondary battery is switched from a sleeping mode or a discharging mode to a charging mode.

The present disclosure may have various effects other than the above, and other effects of the present disclosure may be understood from the following description and more clearly figured out by the embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 3 is an example of a step charging look-up table in which a correlation between a state of charge (SOC) and temperature (T) of the secondary battery and the magnitude of the charging current is predefined.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is deemed that a detailed description of a related known structure or function may obscure the subject matter of the present disclosure, the detailed description thereof will be omitted.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed therebetween.

In this specification, a secondary battery may refer to one independent cell that includes a negative electrode terminal and a positive electrode terminal and is physically separable. For example, one pouch-type lithium polymer cell may be regarded as a secondary battery. In addition, the secondary battery may refer to an assembly of cells connected in series and/or in parallel. For example, a module or pack in which a plurality of lithium polymer cells are connected in series and/or in parallel according to a design capacity may be regarded as a secondary battery.

Figure 1:
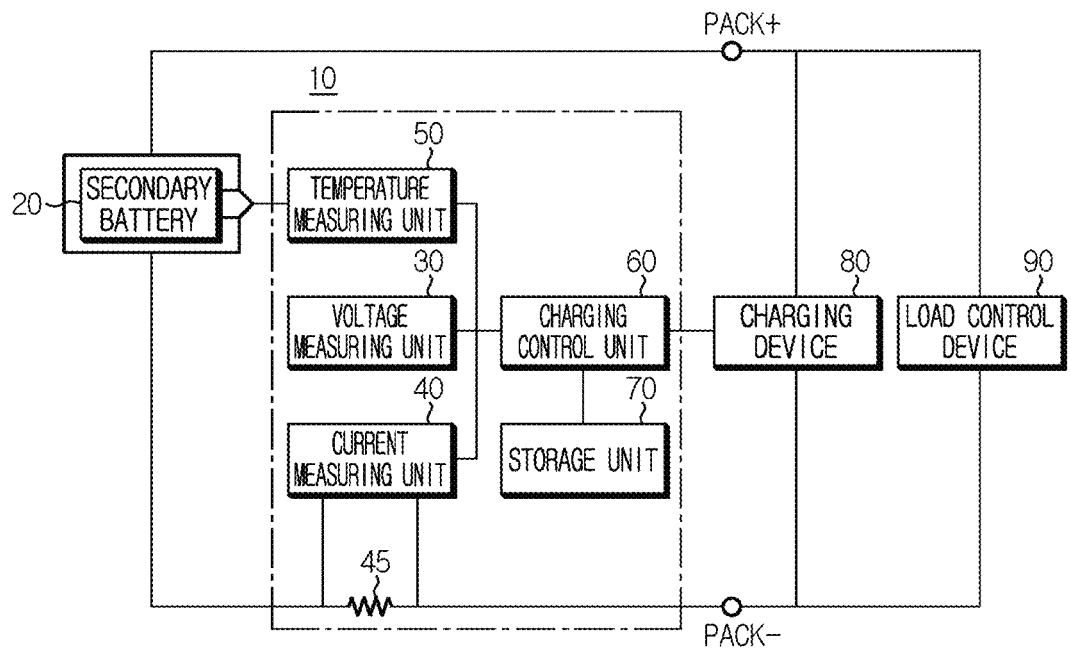
FIG. 1 is a block diagram showing an apparatus for controlling step charging of a secondary battery according to an embodiment of the present disclosure.

FIG. 1 is a block diagram showing an apparatus for controlling step charging of a secondary battery according to an embodiment of the present disclosure.

Referring to FIG. 1, the apparatus 10 for controlling step charging of a secondary battery according to an embodiment of the present disclosure is coupled to a secondary battery 20 to adaptively control step charging of the secondary battery 20.

In the step charging, a SOC region is divided into a plurality of regions, a charging current that can be applied to the secondary battery 20 at maximum is defined in advance for each SOC region, and the predefined charging current is applied to the secondary battery 20 according to the SOC and temperature of the secondary battery 20.

The apparatus 10 for controlling step charging of a secondary battery includes a voltage measuring unit 30, a current measuring unit 40, a temperature measuring unit 50, a charging control unit 60, and a storage unit 70.

The voltage measuring unit 30 periodically measures a voltage between a positive electrode and a negative electrode of the secondary battery 20 according to the request of the charging control unit 60 and outputs the measured voltage value to the charging control unit 60.

The voltage measuring unit 30 may include a floating capacitor for charging and holding the voltage of the secondary battery 20, a voltage sensing circuit for measuring the voltage of the secondary battery 20 charged and held by the floating capacitor, and the like, but the present disclosure is not limited thereto.

When the secondary battery 20 includes a plurality of cells connected in series, the design of the voltage measuring unit 30 may be changed to measure the terminal voltages of the plurality of cells simultaneously or time-differentially. The technique for measuring the terminal voltages of a plurality of cells is well known in the art and thus not described in detail here.

The current measuring unit 40 periodically measures a current flowing through the secondary battery 20 according to the request of the charging control unit 60 and outputs the measured current value to the charging control unit 60. The current flowing through the secondary battery 20 is a charging current or a discharging current.

The current measuring unit 40 may measure a voltage applied to both ends of a sense resistor 45 when the current flows through the secondary battery 20 and output the measured voltage to the charging control unit 60. The both-terminal voltage of the sense resistor 45 corresponds to the measured current value. The charging control unit 60 may convert the both-terminal voltage of the sense resistor 45 into a current by using Ohm's law (V=IR). The current measuring unit 40 may be replaced with other known current sensors such as a hall sensor.

The temperature measuring unit 50 periodically measures a temperature of the secondary battery 20 according to the request of the charging control unit 60 and outputs the measured temperature value to the charging control unit 60.

The temperature measuring unit 50 may be a temperature sensor known in the art, such as a thermocouple, but the present disclosure is not limited thereto.

The storage unit 70 is a storage medium capable of recording and erasing data electrically, magnetically, optically or quantum mechanically. The storage unit 70 may be a RAM, a ROM, a register, a hard disk, an optical recording medium, or a magnetic recording medium, without being limited thereto. The storage unit 70 may be electrically coupled operably to the charging control unit 60 to be accessible by the charging control unit 60, for example, via a data bus.

The storage unit 70 may store and/or update and/or delete a program having various control logics executed by the charging control unit 60, and/or data generated when the control logics are executed, and/or predefined data, parameters, and look-up tables required for executing the various control logics. The storage unit 70 may be logically divided into two or more parts and may also be included in the charging control unit 60.

The charging control unit 60 is a component for controlling the step charging of the secondary battery 20 as a whole.

The charging control unit 60 is a component for executing at least one control logic required to determine SOC and OCV of the secondary battery 20, a polarization voltage, an OCV deviation based on the minimum OCV value and the like and adjust the magnitude of the charging current according to the SOC and the polarization voltage immediately before charging and the temperature of the secondary battery.

The charging control unit 60 may estimate the SOC of the secondary battery 20 by using a predefined extended Kalman filter algorithm as software in a charging mode, a discharging mode and a sleeping mode.

In order to apply the extended Kalman filter in estimating the SOC of the secondary battery 20, it is necessary to define a state equation and an output equation by considering the secondary battery 20 as a system.

In a preferred embodiment, the state equation and the output equation may be derived from a circuit model.

Figure 2:
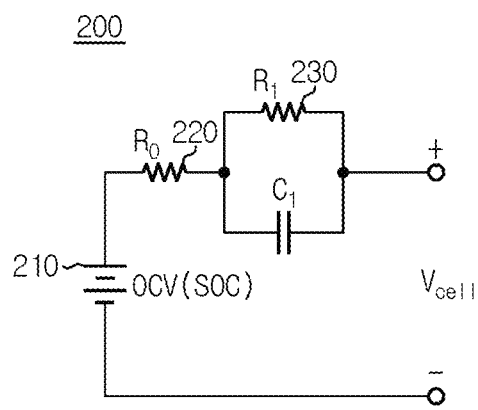
FIG. 2 shows a circuit model according to an embodiment of the present disclosure by which a state equation and an output equation of an extended Kalman filter may be derived.
Figure 4:
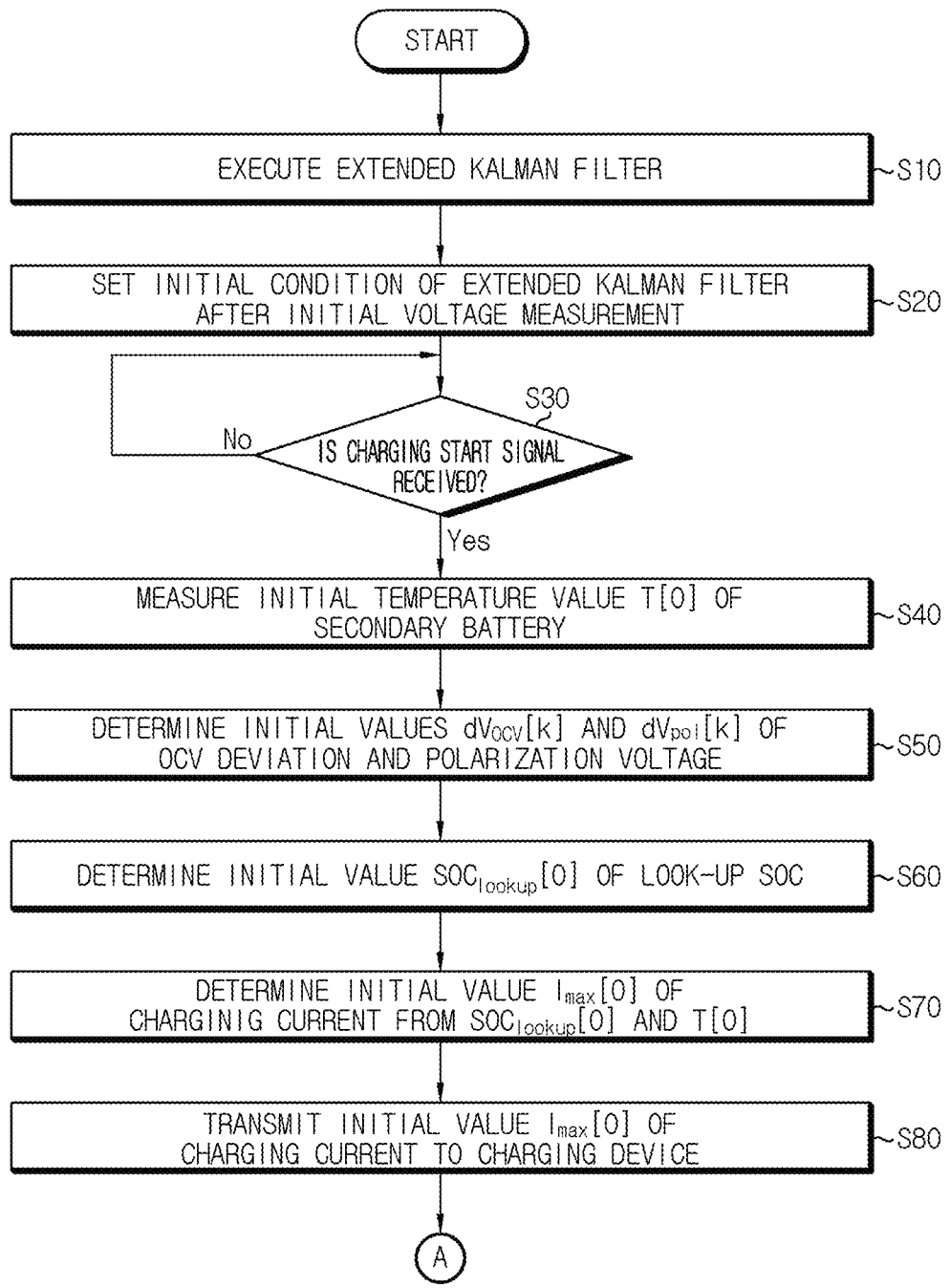
FIGS. 4 to 7 are flowcharts for illustrating a method for controlling step charging of a secondary battery according to an embodiment of the present disclosure.
Figure 5:
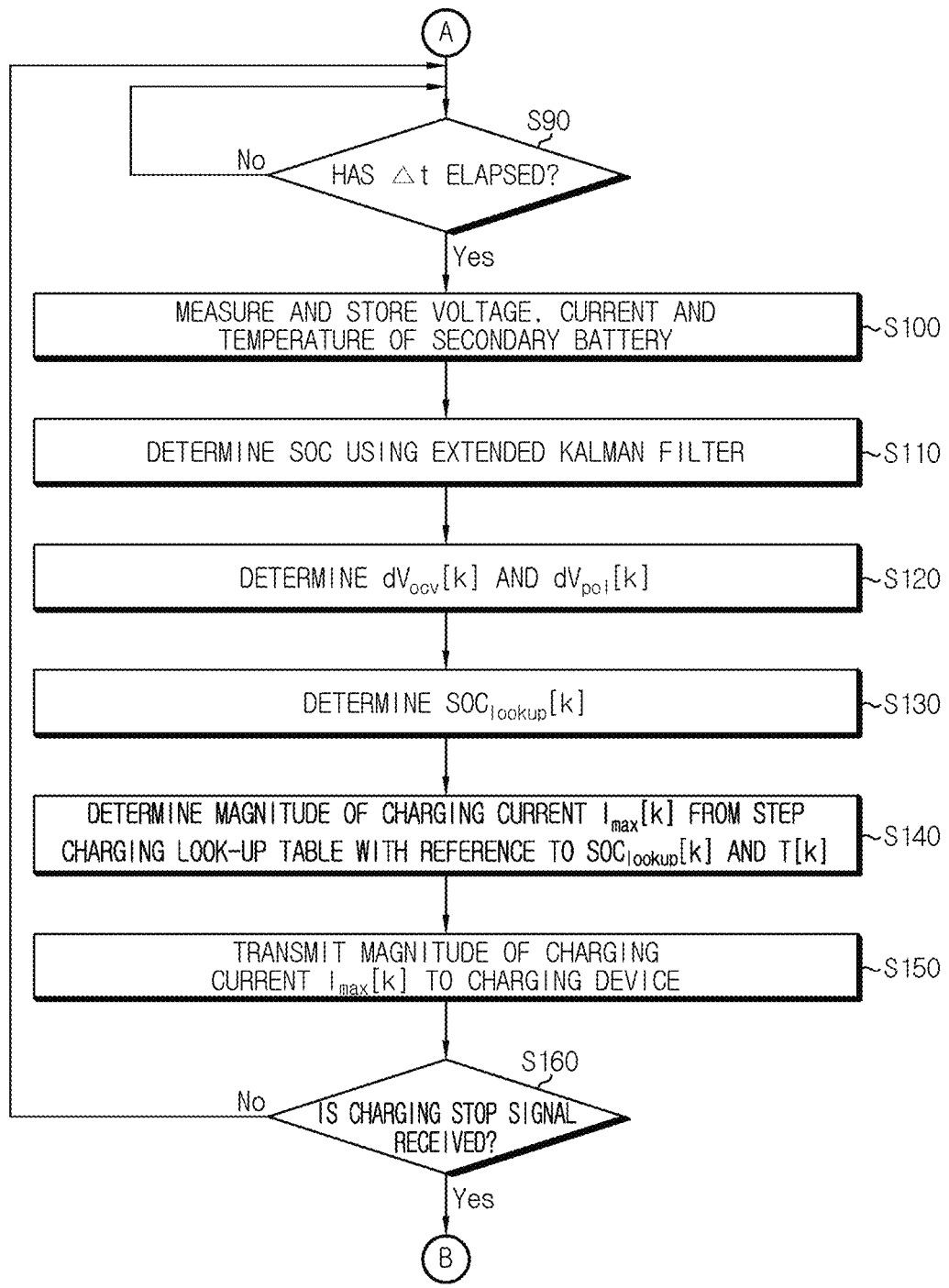
Figure 6:
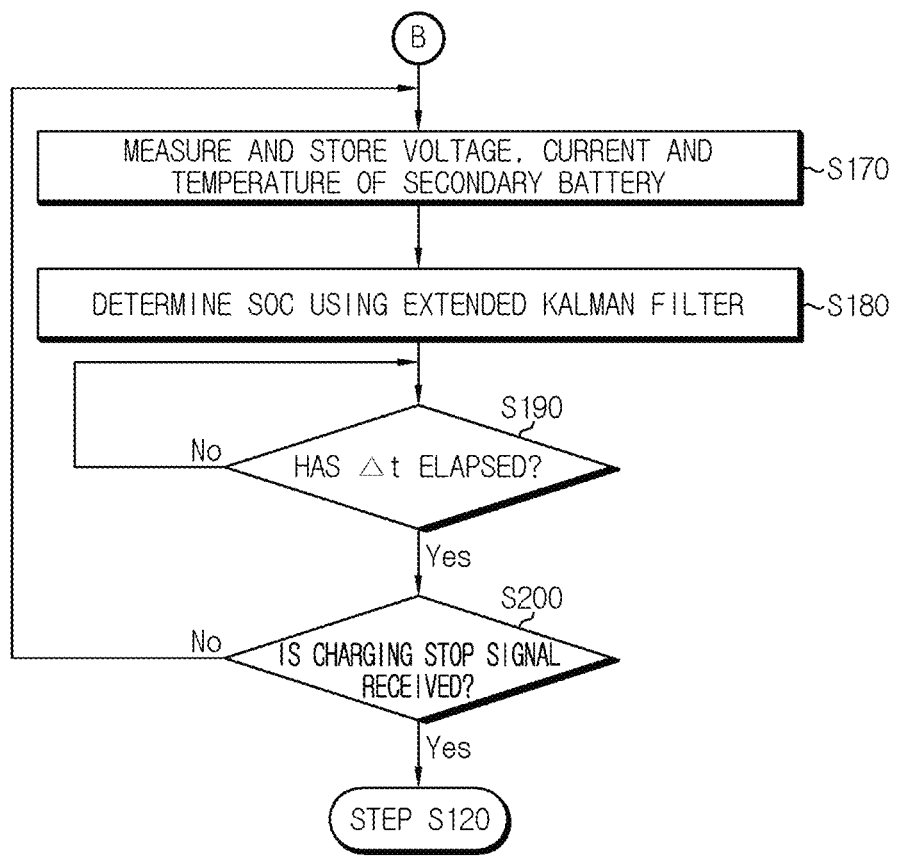

FIG. 2 shows a circuit model 200 according to an embodiment of the present disclosure by which a state equation and an output equation of an extended Kalman filter may be derived.

Referring to FIG. 2, the circuit model 200 includes an OCV source 210 that varies according to the SOC of the secondary battery 20. The OCV formed by the OCV source 210 may vary inherently depending on the SOC.

The OCV source 210 simulates an OCV when the secondary battery 20 is electrochemically stabilized for a long time.

The OCV formed by the OCV source 210 may be defined in advance for each SOC through experiments.

That is, the OCV of the secondary battery 20 is measured for each SOC. After that, the measured data may be interpreted to define a correlation between the OCV and the SOC in the form of a function or a look-up table.

In the present disclosure, the predefined correlation between the OCV and the SOC may be defined by considering the temperature of the secondary battery as another independent variable. That is, the SOC may be defined according to the temperature and the OCV.

The circuit model 200 may include a DC resistor 220 that simulates an internal resistance of the secondary battery 20.

The DC resistor 220 simulates an internal resistance voltage caused by the internal resistance when the secondary battery 20 is charged or discharged.

In the technical field to which the present disclosure belongs, the internal resistance voltage is referred to as an IR voltage. Due to the IR voltage, the voltage measured during charging is greater than the OCV. In contrast, the measured voltage during discharging is lower than the OCV. The resistance value of the DC resistor 220 may be set in advance through experiments.

The circuit model 200 may include at least one RC circuit 230 that simulates the polarization voltage of the secondary battery 20. The RC circuit 230 includes at least one resistor $R_1$ and at least one condenser $C_1$ connected thereto in parallel.

The polarization voltage is a voltage generated by the polarization accumulated on the positive electrode and the negative electrode when the secondary battery 20 is charged or discharged. The resistance value and the capacitance value of the RC circuit 230 may be set in advance through experiments.

Preferably, the state equation and the output equation of the extended Kalman filter according to the present disclosure may be derived from the circuit model 200 described above.

The extended Kalman filter is an adaptive software algorithm that may probabilistically estimate a state of a dynamic system in consideration of externally measurable variables and system disturbances.

The basic principles of the extended Kalman filter are well known in the technical field to which the present disclosure belongs. As an example, see Gregory L. Plett's paper "Kalman filtering for battery management systems of LiPB-based HEV battery packs, Part 1. Background" of Power Source 134, 2004, 252-261, which may be incorporated as a part of this specification.

In the present disclosure, the state equation of the extended Kalman filter includes the SOC of the secondary battery and the polarization voltage of the secondary battery as state variables, and updates the state variables over time.

Specifically, the state equation may include two equations based on a time-discrete model as follows.

$$SOC[k+1] = SOC[k] - \frac{I[k]\Delta t}{Q_{Capacity}} \quad \text{Equation 1}$$

$$V_1[k+1] = \exp\left(-\frac{\Delta t}{R_1 C_1}\right) V_1[k] + R_1\left(1 - \exp\left(-\frac{\Delta t}{R_1 C_1}\right)\right) I[k] \quad \text{Equation 2}$$

Here, Equation 1 is an SOC update equation for time-updating the SOC, which is one of the state variables, by ampere counting.

Equation 2 is a polarization voltage update equation for time-updating the polarization voltage of the secondary battery 20, which is another one of the state variables, by using the RC circuit 230 included in the circuit model 200.

In Equation 1, $Q_{capacity}$ is a capacity of the secondary battery, k is a time index, I is a current measured at the time index k, and $R_1$ and $C_1$ are a resistance value and a capacitance value of the RC circuit included in circuit model 200. The sign of I is negative during charging and positive during discharging. In addition, I is 0 in a sleeping mode in which charging and discharging are not performed.

The state equation represented by Equations 1 and 2 may be expressed by a vector state equation as in Equation 3 using a matrix.

$$\begin{bmatrix} SOC_{k+1} \\ V_{1,k+1} \end{bmatrix} = \begin{bmatrix} 1 & 0 \\ 0 & \exp\left(-\frac{\Delta t}{R_1 C_1}\right) \end{bmatrix} \begin{bmatrix} SOC_k \\ V_{1,k} \end{bmatrix} + \begin{bmatrix} \frac{\Delta t}{Q_{Capacity}} \\ R_1\left(1 - \exp\left(-\frac{\Delta t}{R_1 C_1}\right)\right) \end{bmatrix} I_k \quad \text{Equation 3}$$

In Equation 3, $R_1$, $C_1$ and $Q_{capacity}$ are electric characteristic values that are measured directly through experiments or are tunable through trial and error to minimize a state error of the system estimated by the extended Kalman filter. These values are fixed or may vary depending on the SOC of the secondary battery or the degree of degradation of the secondary battery.

In the present disclosure, the output equation of the extended Kalman filter may be represented by a time-discrete model. That is, the output equation represents the voltage of the secondary battery as an output variable by using the OCV and the polarization voltage according to the SOC of the secondary battery at the time index k and the IR voltage generated by internal resistance of the secondary battery.

Specifically, the output equation may be represented by Equation 4 below based on the time index k.

$$V_{cell}[k] = V_{OCV}[k] + V_1[k] + I[k]R_0 \quad \text{Equation 4:}$$

In Equation 4, $V_{OCV}[k]$ is the OCV of the secondary battery, which is a voltage formed by the OCV source 210 included in the circuit model 200. $V_{OCV}[k]$ may be calculated using a look-up table or a function in which the correlation between SOC and OCV is defined in advance. That is, after the SOC is obtained by Equation 1, the OCV corresponding to the SOC may be determined using the function or the look-up table. The temperature of the secondary battery 20 may be further considered when determining the OCV corresponding to the SOC.

In addition, $V_1[k]$ is a voltage formed by the RC circuit 230 of the circuit model 200 and may be determined using the polarization voltage update equation of Equation 2.

Also, $I[k]R_0$ is an IR voltage formed by the DC resistor 220 of the circuit model 200 and may be determined using the measured current value and the preset resistance value of the DC resistor 220.

In the present disclosure, the charging control unit 60 may adaptively estimate the SOC of the secondary battery 20 by repeatedly executing the extended Kalman filter algorithm at regular intervals using the state equation and the output equation described above.

First, the charging control unit 60 may initialize the SOC and the polarization voltage $V_1$, which are state variables, as follows.

Initialization:

$$V_1[0]=0$$

$$SOC[0]=OCV^{-1}(V_{cell}[0])$$

In the initialization equation, $V_{cell}[0]$ represents an initial voltage measured for the first time after the algorithm of the extended Kalman filter is executed. In addition, $OCV^{-1}$ is an inverse transformation operator for the operator (OCV (SOC)) that converts SOC into OCV. SOC[0] may be easily calculated from the predefined correlation of SOC and OCV.

Here, the predefined correlation may be a look-up table or a look-up function. The look-up table may have a data structure that allows cross reference between SOC and OCV. In addition, the look-up function may have a function form that may receive one of SOC and OCV as an input variable and output the other as an output variable.

Since the extended Kalman filter has robustness for the initial condition, the initial condition of the state variable is not necessarily limited to a specific condition. Therefore, the initial condition of the state variable may be arbitrarily set to satisfy the condition that the state of the system estimated by the extended Kalman filter should not diverge.

After a predetermined time Δt passes, the charging control unit 60 may time-update the SOC and the polarization voltage by using the state equation of Equations 1 and 2.

$$SOC[1] = SOC[0] - \frac{I[0]\Delta t}{Q_{Capacity}} \quad \text{Equation 1}$$

$$V_1[1] = \exp\left(-\frac{\Delta t}{R_1 C_1}\right) V_1[0] + R_1\left(1 - \exp\left(-\frac{\Delta t}{R_1 C_1}\right)\right) I[0] \quad \text{Equation 2}$$

In Equations 1 and 2, I[0] is an initial current value measured by the current measuring unit 40 for the first time and Δt is an increase interval of the time index.

In addition, the charging control unit 60 time-updates an error covariance for the state variables using the following equation. Here, k is 1.

$$\Sigma_{\tilde{x},k}^- = \hat{A}_{k-1} \Sigma_{\tilde{x},k-1}^+ \hat{A}_{k-1}^T + \hat{B}_{k-1} \Sigma_{\tilde{w}} \hat{B}_{k-1}^T \quad \text{Equation 5:}$$

In Equation 5, x is a state variable, k is a time index, w is a process noise of the extended Kalman filter, A and B with the symbol ^ at the top thereof are Jacobian obtained from the state equation, and T is a transposed matrix operator. The parameter with a sigma indicates an error covariance of that parameter. In addition, the error covariance with a minus sign represents a time-updated covariance, and the error covariance with a plus sign represents a previously corrected error covariance.

In Equation 5, when the time index k is 1, the initial value of the error covariance for the state variable at the right side may be set in advance so that the extended Kalman filter does not diverge. For example, the initial value may be set to 0. In addition, the process noise may be properly tuned in consideration of the error of the state equation and the output equation. For example, the process noise $W_{soc}$ for the SOC may be set to 0, and the process noise $W_{v1}$ for the polarization voltage may be set to 0.1. The two process noise values may be changed, and the reliability of the current counting value and the polarization voltage value may be determined by adjusting the ratio of the process noise for the SOC and the process noise for the polarization voltage.

After the time update of the error covariance is completed, the charging control unit 60 measures the current I[1] and the voltage V[1] of the secondary battery 20 using the current measuring unit 40 and the voltage measuring unit 30, and estimates the voltage $V_{cell}[1]$ of the secondary battery as an output variable by applying the time-updated state variable $V_1[1]$, the measured current I[1] and the OCV $V_{OCV}[1]$ corresponding to the time-updated SOC[1] to Equation 4.

$$V_{cell}[1] = V_{OCV}[1] + V_1[1] + I[1] R_0 \quad \text{Equation 4:}$$

After that, the charging control unit 60 applies the time-updated error covariance to the following equation to determine a Kalman gain L when the time index k is 1.

$$L_k = \Sigma_{\tilde{x},k}^- \hat{C}_k^T [\hat{C}_k^T \Sigma_{\tilde{x},k}^- \hat{C}_k^T + \tilde{D}_k \Sigma_{\tilde{v}} \tilde{D}_k^T]^{-1} \quad \text{Equation 6:}$$

In Equation 6, C and D with the symbol ^ at the top thereof are Jacobian obtained from the output equation, v is a sensor noise of the extended Kalman filter, and T is a transposed matrix operator. The sensor noise is caused by an error of the voltage measuring unit 30, the current measuring unit 40 and the temperature measuring unit 50 and may be tuned to an appropriate value. For example, the sensor noise may be set to 0.01.

Subsequently, the charging control unit 60 estimates the state variable by applying the determined Kalman gain L, the measured voltage V[1] and the time-updated state variable to the following equation, thereby correcting the state variable.

$$\hat{x}_k^+ = \hat{x}_k^- + L_k(\hat{z}_k - \hat{z}_k) \quad \text{Equation 7:}$$

In Equation 7, x and z represent a state variable and an output variable, respectively, the symbol − indicates that the state variable is a time-updated state variable, the symbol + indicates that the state variable is an estimated state variable, z with the symbol ^ at the top thereof is a predicted voltage $V_{cell}[1]$ of the secondary battery, and z without the symbol ^ is an actually measured voltage V[1] of the secondary battery.

Preferably, the charging control unit 60 may estimate the SOC of the secondary battery by extracting the SOC from the state variables estimated by Equation 7.

Finally, the charging control unit 60 corrects the error covariance of the state variable by applying the determined Kalman gain, the Jacobian C and the error covariance of the time-updated state variable to the following equation.

$$\Sigma_{\tilde{x},k}^+ = (I - L_k \hat{C}_k) \Sigma_{\tilde{x},k}^- \quad \text{Equation 8:}$$

The series of calculations described above is repeatedly executed when the time index k increases by 1, namely whenever the time Δt elapses. In addition, the error covariance of the state variable estimated by Equation 7 and the state variable corrected by Equation 8 is used again to time-update the state variable and the error covariance at the calculation period of the next cycle.

The charging control unit 60 periodically determines the state variable of the secondary battery 20, namely the SOC (SOC[k]) and the polarization voltage ($V_1[k]$) by executing the extended Kalman filter during the charging mode, the discharging mode or the sleeping mode of the secondary battery 60, and record the estimated SOC (SOC[k]) and the polarization voltage ($V_1[k]$) in the storage unit 70.

In addition, the charging control unit 60 further determines parameters $dV_{OCV}[k]$ and $dV_{pol}[k]$ according to Equation 9 below.

$$dV_{OCV}[k] = V_{OCV}[k] - V_{OCV,min}[k]$$

$$dV_{pol}[k] = V_{cell}[k] - V_{OCV}[k] - I[k] R_0 = V_1[k] \quad \text{Equation 9:}$$

In Equation 9, $V_{OCV,min}$ corresponds to a minimum OCV value, which is indicative of the OCV of the secondary battery 20 when the discharging of the secondary battery 20 is stopped and a no-load state is maintained for a sufficient time after the secondary battery 20 under a discharging mode in a nominal C-rate reaches a minimum discharging voltage $V_{min}$.

$V_{OCV,min}$ may be set to 3.0V when the secondary battery 20 is a lithium polymer cell, but the present disclosure is not limited thereto. $dV_{OCV}[k]$ is a parameter representing the difference between the current OCV of the secondary battery 20 and the minimum OCV value. Therefore, $dV_{OCV}[k]$ may be defined as an OCV deviation.

In addition, $V_{OCV}[k]$ corresponds to SOC (SOC[k]) estimated at regular time intervals by the extended Kalman filter and may be determined from a predefined SOC-OCV look-up table.

In addition, $dV_{pol}[k]$ corresponds to $V_1[k]$ of Equation 4, which is indicative of the polarization voltage ($V_1[k]$) determined by Equation 3 of the extended Kalman filter at a predetermined time interval.

In Equation 9, $V_{OCV,min}$ is predetermined through a discharge experiment and may be fixed or varied depending on the degree of degradation of the secondary battery 20.

The degree of degradation of the secondary battery 20 may be determined from a slope of an I-V linear equation. That is, the charging control unit 60 may calculate the I-V linear equation by a least square method using a plurality of voltage data and current data accumulated in the storage unit 70 and determine the slope of the I-V linear equation as the internal resistance of the secondary battery 20. In addition, the charging control unit 60 may determine an increase rate (%) of the internal resistance based on the initial internal resistance of the secondary battery 20 recorded in the storage unit 70 in advance and determine (100%-increase rate) as the degree of degradation value.

Since the present disclosure is not limited by the method of calculating the degree of degradation, it is obvious that the degree of degradation may be calculated using other methods known in the technical field to which the present disclosure belongs, in addition to the method of calculating the degree of degradation using internal resistance.

Preferably, the charging control unit 60 controls the charging of the secondary battery 20 by a step charging manner with reference to the predefined correlation between the SOC of the secondary battery 20 and the charging current and between the temperature and the charging current, for example the step charging look-up table.

FIG. 3 is an example of a step charging look-up table in which a correlation between the state of charge (SOC) and temperature (T) of the secondary battery 20 and the magnitude of the charging current is predefined.

In an embodiment, when performing the step charging of the secondary battery 20, the charging control unit 60 may regularly control the magnitude of the charging current applied to the secondary battery 20 for each SOC region with reference to the step charging look-up table shown in FIG. 3.

In the step charging look-up table, the first row represents the SOC and the first column represents the temperature. The magnitude of the charging current is mapped to a value of a position where the SOC of the first row and the temperature of the first column meet.

When the temperature of the secondary battery 20 is 25° C., in the 10-36% SOC region, the magnitude of the charging current size is mapped to 150 A. In addition, in the 36-40% SOC region, the magnitude of the charging current is mapped to 100 A. Also, in the 40-100% SOC region, the magnitude of the charging current is mapped to 50 A.

Similarly, when the temperature of secondary battery 20 is 15° C., in the 10-26% SOC region, the magnitude of the charging current is mapped to 150 A. In addition, in the 26-36% SOC region, the magnitude of the charging current is mapped to 100 A. Also, in the 36-100% SOC region, the magnitude of the charging current is mapped to 50 A.

Similarly, when the temperature of secondary battery 20 is 35° C., in the 10-40% SOC region, the magnitude of the charging current is mapped to 150 A. In addition, in the 40-45% SOC region, the magnitude of the charging current is mapped to 100 A. Also, in the 45-100% SOC region, the magnitude of the charging current is mapped to 50 A.

The charging control unit 60 may determine the magnitude of the charging current corresponding to the SOC estimated using the extended Kalman filter and the temperature of the secondary battery 20 measured by the temperature measuring unit 50 by mapping from the step charging look-up table.

The mapped magnitude of the charging current is a maximum charging current that can be applied to the secondary battery 20 without causing side reaction of the secondary battery 20 such as lithium precipitation when the secondary battery 20 is charged in the corresponding SOC region, and it may be set in advance through charging experiments.

As a specific example, if the SOC estimated using the extended Kalman filter and the temperature are 26% and 25° C., respectively, the magnitude of the charging current is determined to be 150 A. In addition, if the temperature of the secondary battery 20 is maintained at 25° C., the charging current of the secondary battery 20 is maintained to 150 A when the SOC is within the 10-36% region. However, if the SOC of secondary battery 20 increases to 36%, the magnitude of the charging current applied to secondary battery 20 is decreased to 100 A, and the charging current of 100 A may be maintained identically in the 36-40% SOC region.

Preferably, if the secondary battery 20 is switched from the sleeping mode, namely a no-load state, to the charging mode or from the discharging mode to the charging mode, the charging control unit 60 maps the charging current in a different way from the common step charging control manner. This will be described below in detail.

When the secondary battery 20 is switched from the sleeping mode, namely the no-load state, to the charging mode or from the discharging mode to the charging mode, the charging control unit 60 may determine a look-up SOC ($SOC_{lookup}[k]$) to be used for looking-up by correcting the SOC ($SOC_{estimated}[k]$) estimated by the extended Kalman filter by using Equation 10 immediately before the start of charging.

$$SOC_{lookup}[k]=SOC_{estimated}[k]-dSOC(dV_{OCV}[k],dV_{pol}[k])\quad\text{Equation 10:}$$

In Equation 10, $dSOC(dV_{OCV}[k], dV_{pol}[k])$ may be a predefined correlation between $dV_{OCV}[k]$ and $dV_{pol}[k]$ determined using Equation 9 and dSOC corresponding to the correction factor of the SOC, for example a correction factor look-up table. The correction factor look-up table may be defined for each temperature of the secondary battery 20.

The change direction of the correction factor dSOC and the change direction of $dV_{ocv}[k]$ are the same. Therefore, if $dV_{OCV}[k]$ is increased while $dV_{pol}[k]$ is not changed, the decrease amount of $SOC_{estimate}[k]$ is increased. On the contrary, if $dV_{OCV}[k]$ is decreased while $dV_{pol}[k]$ is not changed, the decrease amount of $SOC_{estimate}[k]$ is decreased.

Meanwhile, the change direction of the correction factor dSOC and the change direction of $dV_{pol}[k]$ are opposite to each other. Therefore, if $dV_{pol}[k]$ is increased while $dV_{OCV}[k]$ is not changed, the decrease amount of $SOC_{estimate}[k]$ is decreased. On the contrary, if $dV_{pol}[k]$ is decreased, the decrease amount of $SOC_{estimate}[k]$ is increased. In addition, if the secondary battery 20 is switched from the discharging mode to the charging mode, since $dV_{pol}[k]$ is a negative value in the discharging mode, the decrease amount of $SOC_{estimate}[k]$ is relatively greater than the case where the secondary battery 20 is switched from the sleeping mode to the charging mode.

The correction factor dSOC according to $dV_{OCV}[k]$ and $dV_{pol}[k]$ may be determined in advance through the charging experiment of the secondary battery 20.

That is, the state of the secondary battery 20 is adjusted such that the OCV deviation of the secondary battery 20 becomes $dV_{OCV}[k]$, the polarization voltage of the secondary battery 20 becomes $dV_{pol}[k]$, the SOC of the secondary battery 20 becomes $SOC_{estimate}[k]$ and the temperature of the secondary battery becomes $T[k]$. Here, $dV_{OCV}[k]$, $dV_{pol}[k]$ and $SOC_{estimate}[k]$ may be adjusted to various values. After that, the magnitude of the charging current corresponding to $SOC_{estimate}[k]$ and $T[k]$ is identified with reference to the look-up table as defined in FIG. 3, and the SOC change amount of the secondary battery 20 is determined by counting the charging current applied to the secondary battery 20 until the negative electrode potential becomes 0 while applying the identified charging current to secondary battery 20. After that, a difference value between the sum of $SOC_{estimate}[k]$ and the SOC change amount and an upper limit of the SOC region to which $SOC_{estimate}[k]$ belongs is determined as dSOC corresponding to $dV_{OCV}[k]$, $dV_{pol}[k]$ and $T[k]$. Preferably, it will be apparent to those skilled in the art that the dSOC value determined experimentally can be reduced by a predetermined % in consideration of a safety margin.

If the above charging experiment is performed on $dV_{OCV}[k]$, $dV_{pol}[k]$, $SOC_{estimate}[k]$ and $T[k]$ under various conditions, the correction factor look-up table according to temperature may be generated. The generated correction factor look-up table may be recorded and updated in the storage unit 70.

For example, referring to FIG. 3, when $SOC_{estimate}[k]$ is 34% and $T[k]$ is 25° C., the magnitude of the charging current mapped from this condition is 150 A. If the SOC change amount is 4% when the charging current 150 A is applied to the secondary battery 20 until the negative electrode potential becomes 0, since the sum of $SOC_{estimate}[k]$ and the SOC change amount is 38% and the upper limit of the SOC region to which $SOC_{estimate}[k]$ belongs, namely the 10-36% SOC region in which the charging current is set to 150 A, is 36%, dSOC may be determined to be 2%.

Preferably, the charging control unit 60 may determine the initial value of the charging current by mapping the magnitude of the charging current corresponding to the look-up SOC ($SOC_{lookup}$) determined using Equation 10 before the start of charging and the charging start temperature of the secondary battery 20 measured by the temperature measuring unit 50 just before the start of charging from the step charging look-up table.

In addition, when charging of the secondary battery 20 is started, the charging control unit 60 controls a charging device 80 to apply the charging current to the secondary battery 20 constantly. At the same time, the charging control unit 60 periodically measures the voltage, current and temperature of the secondary battery 20 through the voltage measuring unit 30, the current measuring unit 40 and the temperature measuring unit 50, and records the measured values in the storage unit 70.

In addition, the charging control unit 60 may repeat at regular intervals the control logic of estimating an SOC ($SOC_{estimate}$) of the secondary battery 20 using an extended Kalman filter, determining $dV_{ocv}$ and $dV_{pol}$ values (see Equation 9), determining a correction factor dSOC corresponding to the $dV_{ocv}$ and $dV_{pol}$ values with reference to the correction factor look-up table, determining a look-up SOC ($SOC_{lookup}$) by correcting the SOC ($SOC_{estimate}$) using the correction factor dSOC (see Equation 10), mapping the magnitude of the charging current corresponding to the look-up SOC ($SOC_{lookup}$) and the temperature of the secondary battery 20 from the step charging look-up table, and providing the mapped magnitude of the charging current to the charging device 80 so that the charging device 80 applies the corresponding charging current to the secondary battery 20.

If the charging manner is changed as above, the look-up SOC ($SOC_{lookup}$) to which the correction factor of dSOC is reflected is used rather than the SOC ($SOC_{estimate}$) estimated by the extended Kalman filter in mapping the magnitude of the charging current from the step charging look-up table and thus it is possible to increase a boundary value of the SOC region where the magnitude of the charging current is reduced.

For example, referring to FIG. 3, if the SOC ($SOC_{estimate}$) of the secondary battery 20 estimated by the extended Kalman filter is 36% and the temperature of the secondary battery 20 is 25° C., the magnitude of the charging current determined from the step charging look-up table is 100 A. However, in the present disclosure, since the magnitude of the charging current is mapped based on the look-up SOC ($SOC_{lookup}$) corresponding to 36%-dSOC, 150 A is determined as the charging current. Therefore, the time period, in which the charging current of 150 A is applied, increases as much as the SOC region corresponding to the correction factor dSOC. In addition, the magnitude of the charging current is reduced to 100 A in the SOC corresponding to 36%+dSOC based on the SOC ($SOC_{estimate}$) estimated by the extended Kalman filter. As described above, if the upper limit of the SOC region where the magnitude of the charging current is relatively large is increased, the charging time may be shortened.

In addition, the correction factor dSOC is experimentally determined in advance by applying a condition that the negative electrode potential of the secondary battery 20 does not decrease below 0 (zero). Therefore, even if the upper limit of the SOC region where the magnitude of the charging current is relatively large is increased, it is possible to prevent lithium precipitation from occurring on the surface of the negative electrode.

According to another aspect, the charging control unit 60 may be implemented as a micro control unit (MCU) including a microprocessor. In this embodiment, the charging control unit 60 may optionally include a processor known in the art to execute the control logic described above, an application-specific integrated circuit (ASIC), another chipset, a logic circuit, a register, a communication modem, a memory device, a data processing device, or the like.

In addition, the control logic described above may be coded into a program executable in the MCU unit, stored in a storage medium accessible by the processor of the MCU unit and executed therefrom. If the storage unit 70 is integrated in the MCU unit, it is not restricted that the program is recorded in the storage unit 70.

The storage medium is not particularly limited as long as it is accessible by a processor included in a computer. As an example, the storage medium includes at least one selected from the group consisting of a ROM, a RAM, a register, a CD-ROM, a magnetic tape, a hard disk, a floppy disk and an optical data recording device.

The code scheme may be modulated into a carrier signal to be included in a communication carrier at a particular point in time, and also distributed to a networked computer to be stored and executed therein. In addition, functional programs, codes and code segments for implementing the combined control logics may be easily inferred by programmers in the art to which the present disclosure belongs.

According to another aspect, the charging control unit 60 may be connected to the charging device 80 through a communication interface to transmit and receive data to/from the charging device 80. In this case, the charging control unit 60 may transmit data regarding the magnitude of the charging current determined using the step charging look-up table to the charging device 80 through the communication interface. Then, the charging device 80 may apply the charging current corresponding to the magnitude of the charging current determined by the charging control unit 60 to the secondary battery 20 with reference to the received information.

Preferably, the charging device 80 may be a charging station of an electric vehicle connected to a commercial power grid or a charging inverter control device of the electric vehicle, but the present disclosure is not limited thereto.

Preferably, the communication interface may be a wired communication interface such as a CANN communication interface, an RS232 communication interface and the like, or a short-range wireless communication interface such as Zigbee, Bluetooth, Wi-Fi and the like.

The apparatus for controlling step charging of a secondary battery according to an embodiment of the present disclosure may be included in an electric-driven device.

The electric-driven device includes various devices receiving power from a secondary battery pack, such as smart phones, tablet PCs, laptop computers, electric vehicles, hybrid vehicles, plug hybrid vehicles, electric bicycles, drones, power storage devices, uninterruptible power supplies, and the like.

In addition, the apparatus for controlling step charging of a secondary battery according to the present disclosure may be included in a battery management system for controlling charging and discharging of the secondary battery as a whole.

FIGS. 4 to 7 are flowcharts for illustrating a method for controlling step charging of a secondary battery according to an embodiment of the present disclosure.

Hereinafter, a method for controlling step charging of a secondary battery according to an embodiment of the present disclosure will be described in detail with reference to FIGS. 4 to 7.

First, in Step S10, the charging control unit 60 executes an extended Kalman filter. The extended Kalman filter may be coded into a program and recorded in the storage unit 70.

In Step S20, the charging control unit 60 measures a terminal voltage of the secondary battery 20 for the first time through the voltage measuring unit 30 after the extended Kalman filter is executed, and initializes a polarization voltage ($V_1[k]$) and a SOC ($SOC[k]$) estimated by the extended Kalman filter according to the following equation.

$$V_1[0]=0$$

$$SOC[0]=OCV^{-1}(V_{cell}[0])$$

In the initialization equation, $V_{cell}[0]$ represents an initial voltage measured for the first time after the algorithm of the extended Kalman filter is executed. Also, $OCV^{-1}$ is an inverse transformation operator for the operator ($OCV$ ($SOC$)) that converts SOC into OCV.

In Step S30, the charging control unit 60 determines whether a charging start signal is transmitted from the charging device 80. If the determination in Step S30 is NO, the charging control unit 60 holds the progress of the process. Meanwhile, if the determination in Step S30 is YES, the process proceeds to Step S40.

In Step S40, the charging control unit 60 measures a temperature of the secondary battery 20 through the temperature measuring unit 50 and records the measured initial temperature value T[0] in the storage unit 70. Step S50 is executed after Step S40.

In Step S50, the charging control unit 60 initializes $dV_{OCV}$ and $dV_{pol}$ using Equation 9 as in the following equation.

Initialization:

$$dV_{OCV}[0]=V_{OCV}[0]-V_{OCV,min}[0]$$

$$dV_{pol}[0]=V_{cell}[0]-V_{OCV}[0]-I[0]R_0$$

$V_{ocv}[0]$ is determined from SOC[0] by referring to the SOC-OCV look-up table. $dV_{OCV,min}[0]$ is a parameter value previously recorded in the storage unit 70. In the equation for $dV_{pol}[0]$, I[0] is 0 since charging of secondary battery 20 is not initiated and SOC[0] is calculated from $V_{cell}[0]$, so $V_{cell}[0]$ and $V_{OCV}[0]$ are the same. Thus, $dV_{pol}[0]$ is zero.

Step S60 is performed after Step S50.

In Step S60, the charging control unit 60 determines the initial value $SOC_{lookup}[0]$ of the look-up SOC with reference to Equation 10 and the correction factor look-up table dSOC ($dV_{OCV}[k]$, $dV_{pol}[k]$). Step S70 is performed after Step S60.

Initialization:

$$SOC_{lookup}[0]=SOC[0]-dSOC(dV_{OCV}[0],dV_{pol}[0])$$

In Step S70, the charging control unit 60 determines the initial value of $I_{max}[0]$ of the charging current from the step charging look-up table (see FIG. 3) by using the initial value $SOC_{lookup}[0]$ of the look-up SOC and the initial temperature value T[0] of the secondary battery 20. Step S80 is performed after Step S70.

In Step S80, the charging control unit 60 transmits the initial value $I_{max}[0]$ of the charging current to the charging device 80. Then, the charging device 80 applies the charging current corresponding to the initial value $I_{max}[0]$ of the charging current to the secondary battery 20. Step S90 is performed after Step S80.

In Step S90, the charging control unit 60 determines whether time Δt has elapsed. If the determination in Step S90 is NO, the charging control unit 60 holds the progress of the process. Meanwhile, if the determination in Step S90 is YES, the process proceeds to Step S100.

In Step S100, the charging control unit 60 measures the voltage, current and temperature of the secondary battery 20 by using the voltage measuring unit 30, the current measuring unit 40 and the temperature measuring unit 50, and records the measured voltage value $V_{cell}[k]$, the measured current value I[k] and the measured temperature value T[k] in the storage unit 70. Here k is 1. Step S110 is performed after Step S100.

In Step S110, the charging control unit 60 determines the SOC of the secondary battery using the extended Kalman filter. Step S120 is performed after Step S110.

In Step S120, the charging control unit 60 determines $dV_{ocv}[k]$ and $dV_{pol}[k]$ using Equation 9. Here, k=1. Step S130 is performed after Step S120.

In Step S130, the charging control unit 60 determines the look-up SOC $SOC_{lookup}[k]$ with reference to Equation 10 and the correction factor look-up table dSOC ($dV_{OCV}[k]$, $dV_{pol}[k]$). Here, k=1. Step S140 is performed after Step S130.

In Step S140, the charging control unit 60 determines the magnitude of the charging current $I_{max}[k]$ from the step charging look-up table with reference to the look-up SOC of $SOC_{lookup}[k]$ and the temperature T[k] of the secondary battery 20. Step S150 is performed after Step S140.

In Step S150, the charging control unit 60 transmits the magnitude of the charging current $I_{max}[k]$ to the charging device 80. Then, the charging device 80 applies the charging current corresponding to the magnitude of the charging current $I_{max}[k]$ to the secondary battery 20. Step S160 is performed after Step S150.

In Step S160, the charging control unit 60 determines whether a charging stop signal is received from the charging device 80. If the determination in Step S160 is NO, the charging control unit 60 proceeds to Step S90. Meanwhile, if the determination in Step S160 is YES, the charging control unit 60 proceeds to Step S170. In Step S160, if the charge stop signal is received, the magnitude of the charging current applied from the charging device 80 becomes 0 and then the sleeping mode in which the charging operation of the secondary battery 20 is stopped begins.

In Step S170, the charging control unit 60 measures the voltage, current and temperature of the secondary battery 20 using the voltage measuring unit 30, current measuring unit 40 and temperature measuring unit 50 even in the sleeping mode, and records the measured voltage value V[k], the measured current value I[k] and the measured temperature value T[k] in the storage unit 70. Here, k is a cumulative number of measurements. Step S180 is performed after Step S170.

In Step S180, the charging control unit 60 determines the SOC of the secondary battery using the extended Kalman filter even in the sleeping mode, and records the determined SOC in the storage unit 70. Step S190 is performed after Step S180.

In Step S190, the charging control unit 60 determines whether time $\Delta t$ has elapsed. If the determination in Step S190 is NO, the charging control unit 60 holds the progress of the process. Meanwhile, if the determination in Step S190 is YES, the process proceeds to Step S200.

In Step S200, the charging control unit 60 determines whether a charging start signal is received from the charging device 80.

If the determination in Step S200 is NO, the charging control unit 60 proceeds to Step S170 to repeat the process of measuring the voltage, current and temperature of the secondary battery 20 in the sleeping mode and estimating the SOC of the secondary battery 20 using the extended Kalman filter.

If the determination in Step S200 is YES, the process proceeds to Step S120. Therefore, $dV_{ocv}[k]$ and $dV_{pol}[k]$ are determined by Equation 9 using the SOC estimated last by the extended Kalman filter, the look-up SOC $SOC_{lookup}[k]$ is determined by Equation 10 using the correction factor look-up table as well as $dV_{ocv}[k]$ and $dV_{pol}[k]$, the magnitude of the charging current $I_{max}[k]$ is determined from the step charging look-up table using the most recently measured temperature T[k] and the look-up SOC $SOC_{lookup}[k]$, and the magnitude of the charging current $I_{max}[k]$ is transmitted to the charging device 80. If the charging device 80 receives data regarding the magnitude of the charging current $I_{max}[k]$ from the charging control unit 60, the charging device 80 applies the charging current corresponding to $I_{max}[k]$ to the secondary battery 20.

Steps S120 to S150 as above are repeated while the charging control unit 60 does not receive a charge stop signal from the charging device 80.

Meanwhile, the method for controlling step charging of the secondary battery 20 according to an embodiment of the present disclosure may be performed even when the secondary battery 20 is switched from the discharging mode to the charging mode. In this case, the process after Step S160 may be changed as shown in the flowchart shown in FIG. 7.

Figure 7:
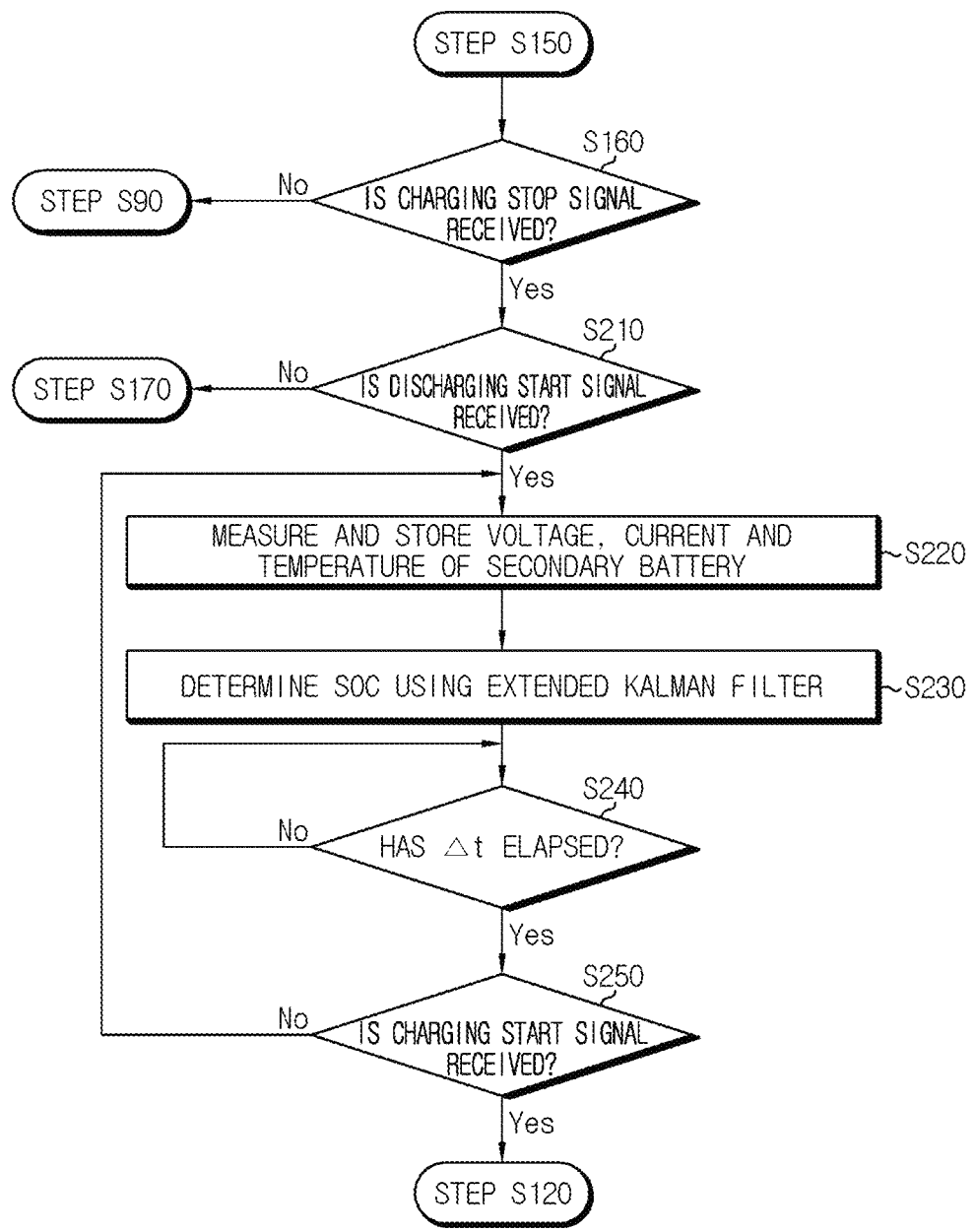

Referring to FIG. 7, if the charging stop signal is transmitted from the charging device 80 in Step S160, the charging control unit 60 determines whether a discharge start signal is received from a load control device 90 (FIG. 1).

The load control device 90 is a device for controlling the operation of a load supplied with the discharging current of the secondary battery 20. For example, the load control device 90 may be a motor control device for controlling a motor of an electric vehicle, but the present disclosure is not limited thereto.

If the determination in Step S210 is NO, the charging process unit 60 proceeds to Step S170. Also, if the determination in Step S210 is YES, the charging control unit 60 starts discharging the secondary battery 20 and at the same time proceeds to Step S220.

In Step S220, the charging control unit 60 measures the voltage, current and temperature of the secondary battery 20 using the voltage measuring unit 30, the current measuring unit 40 and the temperature measuring unit 50, and records the measured voltage value V[k], the measured current value I[k] and the measured temperature value T[k] in the storage unit 70. Here, k is a cumulative number of measurements. Step S230 is performed after Step S220.

In Step S230, the charging control unit 60 determines the SOC of the secondary battery 20 in the discharging mode using the extended Kalman filter. Step S240 is performed after Step S230.

In Step S240, the charging control unit 60 determines whether time $\Delta t$ has elapsed. If the determination in Step S240 is NO, the charging control unit 60 holds the progress of the process. Meanwhile, if the determination in Step S240 is YES, the process proceeds to Step S250.

In Step S250, the charging control unit 60 determines whether a charging start signal is received from the charging device 80.

If the determination in Step S250 is NO, the charging control unit 60 proceeds to Step S220 to repeat a process of measuring the voltage, current and temperature of the secondary battery 20 in the discharging mode and estimating the SOC of the secondary battery 20 using the extended Kalman filter.

If the determination in Step S250 is YES, the process proceeds to Step S120. Therefore, $dV_{ocv}[k]$ and $dV_{pol}[k]$ are determined by Equation 9 using the SOC estimated last in the discharging mode by the extended Kalman filter, the look-up SOC $SOC_{lookup}[k]$ is determined by Equation 10 using the correction factor look-up table as well as $dV_{ocv}[k]$ and $dV_{pol}[k]$, the magnitude of the charging current $I_{max}[k]$ is determined from the step charging look-up table using the most recently measured temperature T[k] and the look-up SOC $SOC_{lookup}[k]$, and the magnitude of the charging current $I_{max}[k]$ is transmitted to the charging device 80. If the charging device 80 receives data regarding the magnitude of the charging current $I_{max}[k]$ from the charging control unit 60, the charging device 80 applies the charging current corresponding to $I_{max}[k]$ to the secondary battery 20.

If the secondary battery 20 is switched from the discharging mode to the charging mode, the polarization voltage has a negative value. Therefore, in correcting the SOC $SOC_{estimate}[k]$ estimated by the extended Kalman filter into the look-up SOC $SOC_{lookup}[k]$ using Equation 10, the value of the correction factor is increased relatively greater when the secondary battery 20 is switched from the discharging mode to the charging mode rather than when the secondary battery 20 is switched from the sleeping mode to the charging mode. Therefore, the effect of extending the upper limit of the SOC region in which the magnitude of the charging current $I_{max}[k]$ is applied is increased more, thereby further shortening the charging time.

Figure 8:
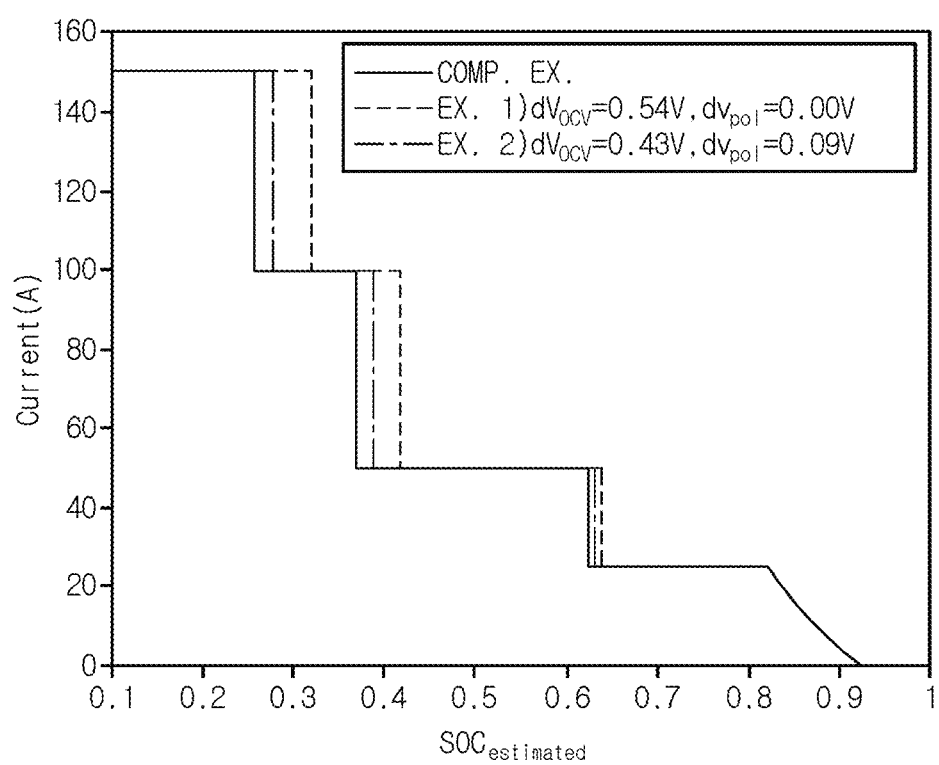
FIG. 8 is a graph showing the change in magnitude of the charging current according to the change of SOC when the secondary battery is charged using a step charging manner according to the present disclosure (Examples 1 and 2) and a conventional step charging manner (a comparative example).

FIG. 8 is a graph showing the change in magnitude of the charging current according to the change of SOC when the secondary battery 20 is charged using the step charging manner according to the present disclosure (Examples 1 and 2) and a conventional step charging manner (a comparative example).

The secondary batteries used in Examples 1 and 2 and the comparative example are pouch-type lithium polymer cells with a capacity of 78 Ah, in which $Li(Ni_{0.6}Co0.2Mn0.2)O_2$ and graphite are used as a positive electrode active material and a negative electrode active material, respectively.

In Example 1, the state of the secondary battery is adjusted so that $dV_{ocv}$ and $dV_{pol}$ become 0.54V and 0.00V, respectively, by adjusting the SOC and the sleeping time of the secondary battery before the start of charging of the secondary battery.

In Example 2, the state of the secondary battery is adjusted so that $dV_{ocv}$ and $dV_{pol}$ become 0.43V and 0.09V, respectively, by adjusting the SOC and the sleeping time of the secondary battery before the start of charging the secondary battery.

In Examples 1 and 2, the magnitude of the charging current is reduced in the order of 150 A, 100 A, 50 A, 25 A. The SOC where the magnitude of the charging current changes is the SOC when the charging current profile suddenly drops. The temperature of the secondary battery is kept constant at 25° C. using a thermostat. The initial value of the look-up SOC $SOC_{lookup}$ is determined from the initial conditions of $dV_{ocv}$ and $dV_{pol}$.

In Examples 1 and 2, the initial value of the charging current is determined to be 150 A in common, and the SOC $SOC_{estimate}$ estimated by the extended Kalman filter is corrected into the look-up SOC $SOC_{lookup}$ using $dV_{ocv}$ and $dV_{pol}$ while applying the corresponding charging current to the secondary battery. In addition, the magnitude of the charging current $I_{max}$ is updated from the step charging look-up table with reference to the look-up SOC and the temperature of the secondary battery.

In the comparative example, the magnitude of the charging current is determined using $SOC_{estimate}$ as it is without correcting the SOC $SOC_{estimate}$ estimated by the extended Kalman filter into the look-up SOC $SOC_{lookup}$.

Referring to FIG. 8, it may be found that in the charging current profiles of Examples 1 and 2, the upper limit of the SOC region where the magnitude of the charging current is maintained is shifted to the right compared to the charging current profile of the comparative example. In addition, it may be found that the profile of Example 1 is moved further to the right than the profile of Example 2.

Figure 9:
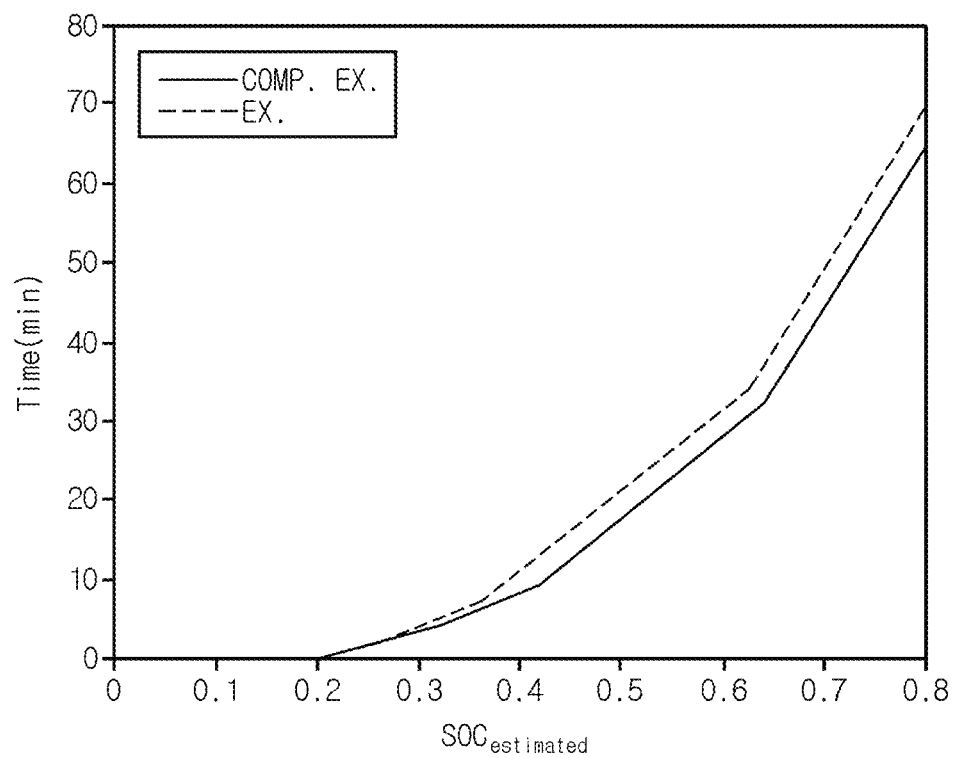
FIG. 9 is a graph showing a charging time when charging is performed according to a charging current profile of Example 1 and according to a charging current profile of the comparative example.
Figure 10:
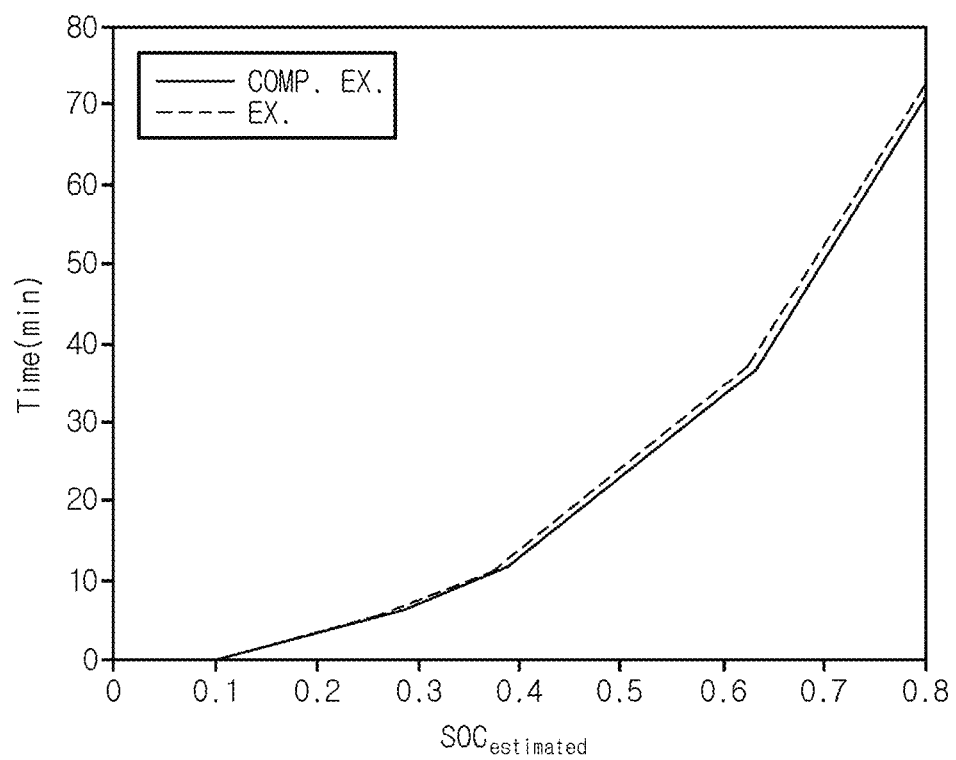
FIG. 10 is a graph comparatively showing a charging time when charging is performed according to a charging current profile of Example 2 and a charging time when charging is performed according to the charging current profile of the comparative example.

FIG. 9 is a graph showing a charging time when charging is performed according to the charging current profile of Example 1 and according to the charging current profile of the comparative example, and FIG. 10 is a graph comparatively showing a charging time when charging is performed according to the charging current profile of Example 2 and a charging time when charging is performed according to the charging current profile of the comparative example.

Referring to FIGS. 9 and 10, it may be found that if the charging current profile of Example 1 is applied, the time taken to increase the SOC from 20% to 80% is reduced by about 5 minutes compared to the comparative example, and if the charging current profile of Example 2 is applied, the time taken to increase the SOC from 20% to 80% is reduced by about 2 minutes compared to the comparative example.

As described above, in the present disclosure, the magnitude of the charging current is adaptively controlled in consideration of the SOC ($dV_{ocv}$) and the polarization voltage ($dV_{pol}$) of the secondary battery before the start of charging at the same time, thereby reducing the step charging time of the secondary battery compared to the conventional art.

In the description of the various exemplary embodiments of the present disclosure, it should be understood that the element referred to as 'unit' is distinguished functionally rather than physically. Therefore, each element may be selectively integrated with other elements or each element may be divided into sub-elements for effective implementation control logic(s). However, it is obvious to those skilled in the art that, if functional identity can be acknowledged for the integrated or divided elements, the integrated or divided elements fall within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

INDUSTRIAL APPLICABILITY

According to the present disclosure, the step charging time of the secondary battery can be shortened compared to the conventional art by adaptively controlling the magnitude of the charging current in consideration of the SOC ($dV_{ocv}$) and the polarization voltage ($dV_{pol}$) of the secondary battery at the same time before the start of charging. In particular, the charging time of the secondary battery can be shortened by increasing the upper limit of a SOC region where the charging current is relatively large. In addition, the charging time may be reduced more effectively by extending the upper limit of a SOC region where the charging current is changed when the secondary battery is switched from a sleeping mode or a discharging mode to a charging mode.

What is claimed is:

1. An apparatus for controlling step charging of a secondary battery, comprising:
   a voltage measuring unit including a voltage sensor, a current measuring unit including a current sensor, and a temperature measuring unit including a temperature sensor configured to respectively measure a voltage, a current and a temperature of the secondary battery; and
   a charging control unit including a processor and operably coupled to the voltage measuring unit, the current measuring unit and the temperature measuring unit,
   wherein the charging control unit is configured to execute control logics including:
     a control logic to estimate a state of charge (SOC) and an open circuit voltage (OCV) of the secondary battery based on the measured voltage value, the measured current value, and the measured temperature value before the start of charging of the secondary battery;
     a control logic to determine a polarization voltage of the secondary battery from an internal resistance of the secondary battery, the measured current value, and the estimated OCV;
     a control logic to determine an OCV deviation corresponding to a difference between the estimated OCV and a predefined minimum OCV value;

a control logic to determine a correction factor corresponding to the determined polarization voltage and the determined OCV deviation with reference to a predefined correlation between the polarization voltage and the correction factor and between the OCV deviation and the correction factor;

a control logic to determine a look-up SOC by correcting the estimated SOC according to the correction factor;

a control logic to determine a magnitude of a charging current corresponding to the look-up SOC and the measured temperature value with reference to a predefined correlation between the SOC and the charging current and between the temperature and the charging current; and a control logic to provide the determined charging current to a charging device so that a charging current corresponding to the determined magnitude of the charging current is applied to the secondary battery.

2. The apparatus for controlling step charging of the secondary battery according to claim 1, wherein the charging control unit is configured to periodically estimate the SOC of the secondary battery from the measured voltage value, the measured current value, and the measured temperature value by using an extended Kalman filter while the secondary battery is in a discharging mode or a sleeping mode and to determine the look-up SOC by correcting an SOC estimated just before the start of charging among the plurality of estimated SOCs.

3. The apparatus for controlling step charging of the secondary battery according to claim 2, wherein the charging control unit is configured to estimate an OCV corresponding to the estimated SOC with reference to a predefined correlation between the SOC and the OCV.

4. The apparatus for controlling step charging of the secondary battery according to claim 1, wherein the charging control unit is configured to determine the polarization voltage according to an equation below:

$$dV_{pol}[k] = V_{cell}[k] - V_{OCV}[k] - I[k]R_0$$

where k is a time index, $dV_{pol}[k]$ is a polarization voltage, $V_{cell}[k]$ is a voltage estimated by an extended Kalman filter or a measured voltage, $V_{OCV}[k]$ is an OCV, $R_0$ is an internal resistance of the secondary battery, and $I[k]$ is a charging current of the secondary battery.

5. The apparatus for controlling step charging of the secondary battery according to claim 1, wherein the charging control unit is configured to determine the OCV deviation according to an equation below:

$$dV_{OCV}[k] = V_{OCV}[k] - V_{OCV,min}[k]$$

where k is a time index, $dV_{ocv}[k]$ is an OCV deviation, $V_{ocv}[k]$ is an OCV, and $V_{ocv,min}$ is a predefined minimum OCV value.

6. The apparatus for controlling step charging of the secondary battery according to claim 1, wherein the charging control unit is configured to determine the look-up SOC according to an equation below:

$$SOC_{lookup}[k] = SOC_{estimated}[k] - dSOC(dV_{OCV}[k], dV_{pol}[k])$$

where k is a time index, $SOC_{lookup}[k]$ is a look-up SOC, $SOC_{estimate}[k]$ is an estimated SOC, $dV_{ocv}[k]$ is an OCV deviation, $dV_{pol}[k]$ is a polarization voltage, and dSOC is a look-up table defining a correlation between the OCV deviation and the correction factor and between the polarization voltage and the correction factor.

7. The apparatus for controlling step charging of the secondary battery according to claim 6, wherein the charging control unit is configured to determine the correction factor to be proportional to the OCV deviation and to determine the correction factor to be inversely proportional to the polarization voltage.

8. An electric-driven device, comprising the apparatus for controlling step charging of the secondary battery according to claim 1.

9. A method for controlling step charging of a secondary battery, comprising:

(a) measuring a voltage, a current and a temperature of the secondary battery while the secondary battery is in a discharging mode or a sleeping mode;

(b) estimating a state of charge (SOC) and an open circuit voltage (OCV) of the secondary battery based on the measured voltage value, the measured current value, and the measured temperature value before the start of charging of the secondary battery;

(c) determining a polarization voltage of the secondary battery from an internal resistance of the secondary battery, the measured current value, and the estimated OCV;

(d) determining an OCV deviation corresponding to a difference between the estimated OCV and a predefined minimum OCV value;

(e) determining a correction factor corresponding to the determined polarization voltage and the determined OCV deviation with reference to a predefined correlation between the polarization voltage and the correction factor and between the OCV deviation and the correction factor;

(f) determining a look-up SOC by correcting the estimated SOC according to the correction factor;

(g) determining a magnitude of a charging current corresponding to the look-up SOC and the measured temperature value with reference to a predefined correlation between the SOC and the magnitude of the charging current and between the temperature the magnitude of the charging current; and (h) providing the determined charging current to a charging device so that a charging current corresponding to the determined magnitude of the charging current is applied to the secondary battery.

10. The method for controlling step charging of the secondary battery according to claim 9, wherein in the (b) step, the SOC of the secondary battery is periodically estimated from the measured voltage value, the measured current value, and the measured temperature value by using an extended Kalman filter while the secondary battery is in the discharging mode or the sleeping mode, and in the (f) step, the look-up SOC is determined by correcting an SOC estimated just before the start of charging among the plurality of estimated SOCs.

11. The method for controlling step charging of the secondary battery according to claim 10, wherein in the (b) step, an OCV corresponding to the estimated SOC is estimated with reference to a predefined correlation between the SOC and the OCV.

12. The method for controlling step charging of the secondary battery according to claim 9, wherein in the (c) step, the polarization voltage is determined according to an equation below:

$$dV_{pol}[k]=V_{cell}[k]-V_{OCV}[k]-I[k]R_0$$

where k is a time index, $dV_{pol}[k]$ is a polarization voltage, $V_{cell}[k]$ is a voltage estimated by an extended Kalman filter or a measured voltage, $V_{OCV}[k]$ is an OCV, $R_0$ is an internal resistance of the secondary battery, and $I[k]$ is a charging current of the secondary battery.

13. The method for controlling step charging of the secondary battery according to claim 9,
wherein in the (d) step, the OCV deviation is determined according to an equation below:

$$dV_{OCV}[k]=V_{OCV}[k]-V_{OCV,min}[k]$$

where k is a time index, $dV_{ocv}[k]$ is an OCV deviation, $V_{ocv}[k]$ is an OCV, and $V_{ocv,min}$ is a predefined minimum OCV value.

14. The method for controlling step charging of the secondary battery according to claim 9, wherein in the (f) step, the look-up SOC is determined according to an equation below:

$$SOC_{lookup}[k]=SOC_{estimated}[k]-dSOC(dV_{OCV}[k],dV_{pol}[k])$$

where k is a time index, $SOC_{lookup}[k]$ is a look-up SOC, $SOC_{estimate}[k]$ is an estimated SOC, $dV_{ocv}[k]$ is an OCV deviation, $dV_{pol}[k]$ is a polarization voltage, and dSOC is a look-up table defining a correlation between the OCV deviation and the correction factor and between the polarization voltage and the correction factor.

15. The method for controlling step charging of the secondary battery according to claim 14,
wherein in the (e) step, the correction factor is determined to be proportional to the OCV deviation and to be inversely proportional to the polarization voltage.

* * * * *